(12) United States Patent
Singh et al.

(10) Patent No.: US 7,932,534 B2
(45) Date of Patent: Apr. 26, 2011

(54) HIGH LIGHT EXTRACTION EFFICIENCY SOLID STATE LIGHT SOURCES

(75) Inventors: Rajiv K. Singh, Gainesville, FL (US); Purushottam Kumar, Gainesville, FL (US); Deepika Singh, Gainesville, FL (US)

(73) Assignees: Sinmat, Inc., Gainesville, FL (US); University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 12/797,330

(22) Filed: Jun. 9, 2010

(65) Prior Publication Data

US 2010/0308359 A1 Dec. 9, 2010

Related U.S. Application Data

(60) Provisional application No. 61/185,476, filed on Jun. 9, 2009.

(51) Int. Cl.
*H01L 33/00* (2010.01)
(52) U.S. Cl. ........... 257/98; 257/E21.129; 257/E31.108; 257/E31.105; 257/E31.094; 257/E33.001; 438/29

(58) Field of Classification Search ............... 257/13, 257/79, 82, 88, 98, 918, E21.129, E31.108, 257/E31.105, E31.103, E31.101, E31.099, 257/E31.094, 31.097, E33.001, E33.061; 438/27–29, 31, 32, 65, 69, 72, 636, 952
See application file for complete search history.

(56) References Cited

U.S. PATENT DOCUMENTS

2007/0018182 A1* 1/2007 Beeson et al. ............... 257/98
* cited by examiner

*Primary Examiner* — Davienne Monbleau
*Assistant Examiner* — Monica D Harrison
(74) *Attorney, Agent, or Firm* — Jetter & Associates, P.A.

(57) ABSTRACT

A solid state light source includes a substrate having a top surface and a bottom surface, and at least one optically active layer on the top surface of the substrate. At least one of the top surface, the bottom surface, the optically active layer or an emission surface on the optically active layer includes a patterned surface that includes a plurality of tilted surface features that have a high elevation portion and a low elevation portion that define a height (h), and wherein the plurality of tilted surface features define a minimum lateral dimension (r). The plurality of tilted surface features provide at least one surface portion that has a surface tilt angle from 3 to 85 degrees. The patterned surface has a surface roughness <10 nm rms, and h/r is $\geq 0.05$.

26 Claims, 11 Drawing Sheets

LONG RANGE MORPHOLOGY
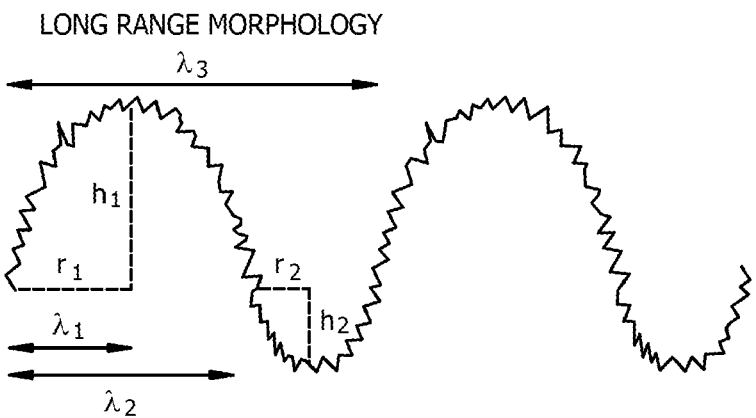
FIG. 7A
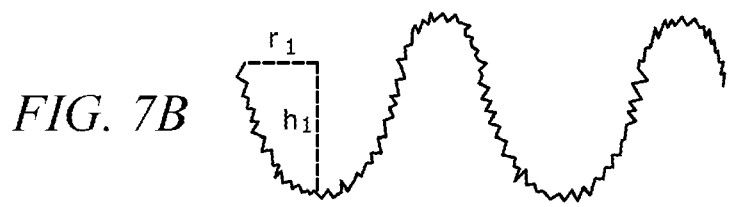
FIG. 7B
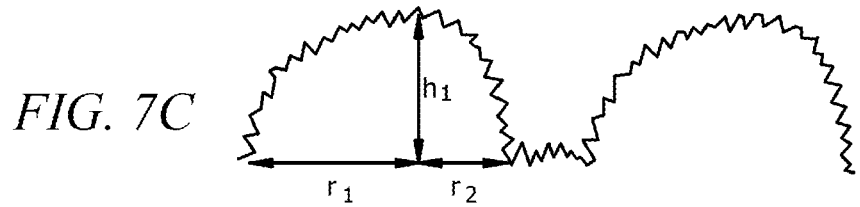
FIG. 7C
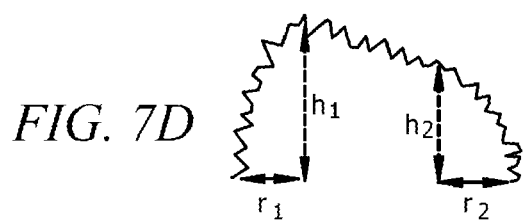
FIG. 7D
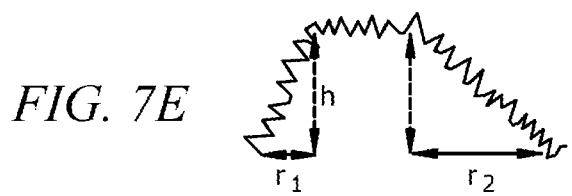
FIG. 7E
Short Range Morphology
FIG. 7F
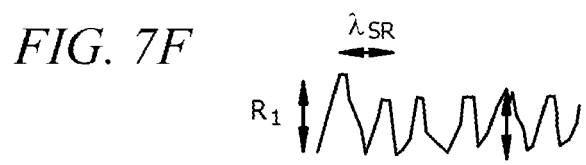

HIGH LIGHT EXTRACTION EFFICIENCY SOLID STATE LIGHT SOURCES

CROSS REFERENCE TO RELATED APPLICATIONS

This application claims the benefit of Provisional Application Ser. No. 61/185,476 entitled "HIGH LIGHT EXTRACTION EFFICIENCY SOLID STATE LIGHT SOURCES", filed Jun. 9, 2009, which is herein incorporated by reference in its entirety.

FIELD OF THE INVENTION

Disclosed embodiments relate to a variant of a chemical mechanical polishing (CMP)/mechanical polishing process for forming patterned surfaces having tilted features and solid state light emitting devices therefrom.

BACKGROUND

As known in the art, the light extraction efficiency of light emitting solid state devices such as light emitting diodes (LEDs), Organic-LEDs (OLEDs), solid state lasers and other solid state light emitting devices is limited, to a large extent, by the out-coupling efficiency or extraction efficiency. The high refractive indices of the substrate and the light generating active layer (relative to the air) leads to total internal reflection (rather than emission) and as a result the wave-guiding of a significant portion of light generated in the active layer. As known in the art, for light to be extracted from the device the light must be within an escape cone which is defined by the critical angle for total internal reflection at the interface (e.g. substrate to air interface). Photons outside the escape cone experience repeated internal reflection and are eventually lost due to absorption. The higher the mismatch in the refractive index at the interface the smaller the escape cone. This is a known major challenge in the realization of practical solid state lighting devices.

The confinement of photons by different layers gives rise to different modes in light emitting devices. Photons entrapped in the active layer stack gives rise to active layer mode(s), photons confined by substrate to substrate mode(s), and photons that are extracted out of the device, to out-coupled mode(s).

Out-coupling efficiency has been improved by the opening of escape cones for each direction (lateral and vertical) by use of thick transparent substrates, shaping of the chips (e.g., LED chips) or by reducing wave-guiding through modification of various interfaces for the device. Interface modification induces photon randomization which changes the incident angle at each incidence, thereby providing multiple chances for photons to escape. Photon randomization has been achieved by simple interface roughening, such as by chemical etching, photochemical etching, electrochemical etching, or by having regular patterned structures at various interfaces, such as Bragg gratings, micro-rings, photonic crystals, microlenses, and micro-pyramids. These techniques can increase surface roughness, cause sub-surface damage, or introduce foreign material contamination into the near-surface layers. Furthermore, such approaches may be complicated, may only be applicable to specific (i.e. discrete) wavelengths, and/or may not be easily integrated into the manufacturing process.

SUMMARY

Disclosed embodiments include high light extraction efficiency solid state light sources that comprise a substrate having a top surface and a bottom surface, and at least one optically active layer on the top surface of the substrate. At least one of the top surface, the bottom surface, the optically active layer or an emission surface on the optically active layer include a patterned surface that includes a plurality of tilted surface features that have a high elevation portion and a low elevation portion that define a height (h), and wherein the plurality of tilted surface features define a minimum lateral dimension (r). The plurality of tilted surface features provide at least one surface portion that has a surface tilt angle from 3 to 85 degrees. The patterned surface has a surface roughness <10 nm rms, and an h/r $\geq$0.05. A patterned surface is provided for at least one interface for the light source, such a first interface between the substrate and the ambient that reduces an intensity of substrate modes propagating in the substrate and a second interface between the substrate and the optically active layer that reduces an intensity of active layer modes propagating in the optically active layer.

Disclosed embodiments also include methods for forming solid state light sources, where the patterned surface(s) are formed using chemical-mechanical fabrication (CMF) processing. CMF is a variant of chemical mechanical polishing (CMP) that forms tilted surface features instead of surface planarization and thus essentially featureless surfaces provided by CMP. The solid state light source can comprise a light source including a light emitting diode (LED), an organic-LED, vertical-cavity surface emitting laser (VCSEL), a quantum dot-based device, a phosphor, or an electroluminescent device.

BRIEF DESCRIPTION OF THE DRAWINGS

FIGS. 7A-E show exemplary feature shapes having components defined for the long range quasi periodic morphology parameter (LRQP) for several exemplary structures formed by CMF, according disclosed embodiments, while FIG. 7F shows components for short range morphology (SRM) from an exemplary structure formed by CMF.

DETAILED DESCRIPTION

Figure 1A:
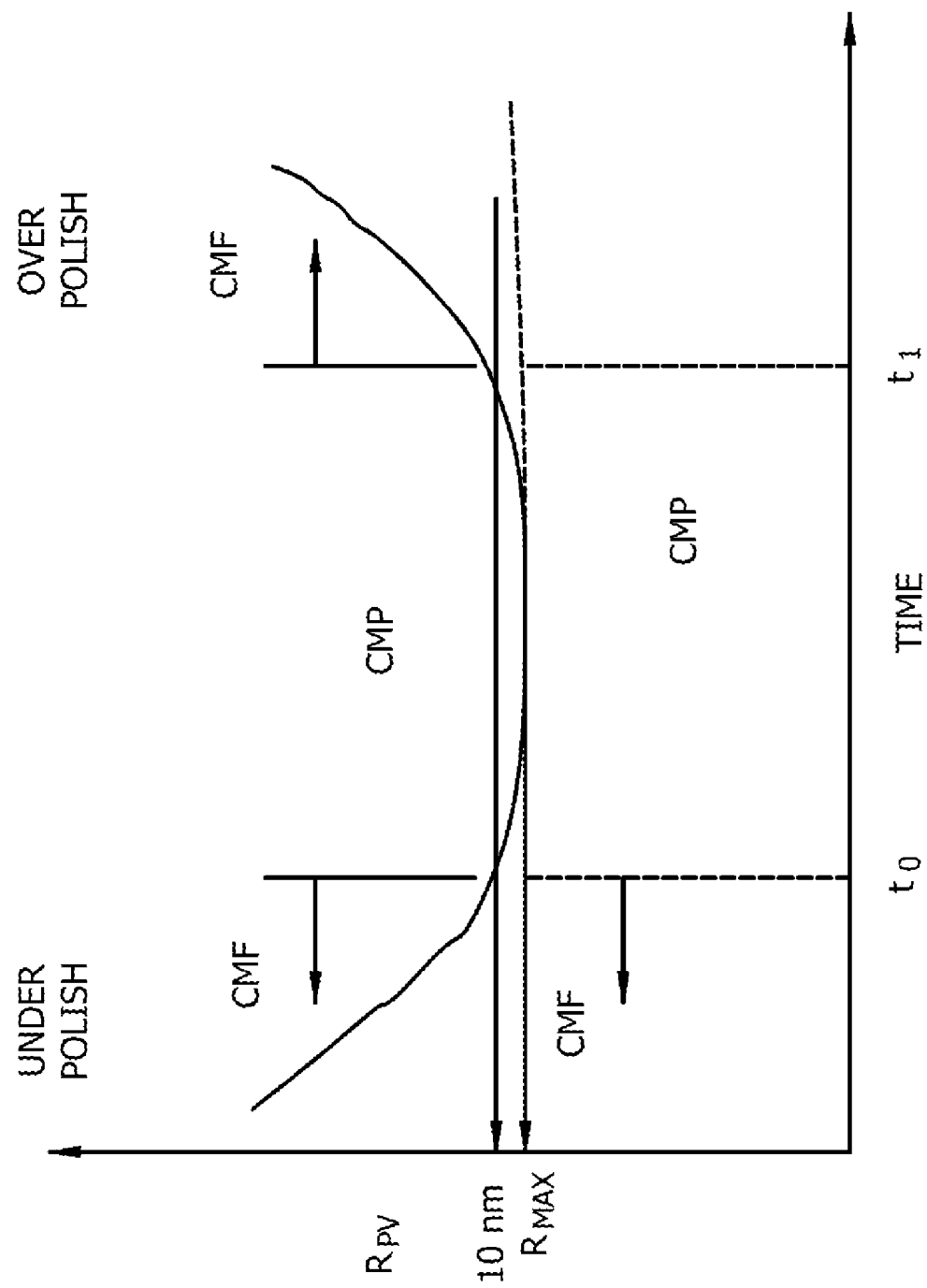
FIG. 1A shows a plot of the high to low (or peak to valley) height ($R_{pv}$) of feature(s) formed as a function of polishing time that defines the chemical mechanical formation (CMF) polishing time zones relative to conventional chemical mechanical polishing (CMP) along with a cross sectional depiction of the resulting structure as the polishing time proceeds, according to an embodiment of the invention.

Disclosed embodiments are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the disclosed embodiments can be practiced without one or more of the specific details or with other methods. In other instances, well-known structures or operations are not shown in detail to avoid obscuring the disclosed embodiments. The disclosed embodiments are not limited by the illustrated ordering of acts or events, as some acts may occur in different orders and/or concurrently with other acts or events. Furthermore, not all illustrated acts or events are required to implement a methodology in accordance with disclosed embodiments.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Disclosed embodiments describe CMF methods for forming solid state light sources having patterned surfaces comprising at least one, and generally a plurality of tilted surface features. Solid state light sources from CMF are also disclosed.

As described above, CMF is a chemical polishing process that is a variant of CMP. As described above, CMF is a variant of CMP. In conventional CMP, the surfaces formed are generally substantially planar throughout and are thus essentially featureless surfaces. As defined herein, a substantially planar surface (such as provided by a conventional CMP process) is characterized by absence of surface features, or surface features that have a maximum tilt angle of 2 degrees, and a h/r ratio of the features that is <0.005, wherein "h" refers to the height/vertical distance of the features, and "r" refers to the minimum lateral distance(s) for the features in arrangements where h is changing (i.e. non-planar). In contrast, patterned surfaces provided by CMF methods according to embodiments of the invention comprise at least one tilted surface feature having at least one surface portion that provides a tilt angle in the range from 3 to 85 degrees, with a typical range from 10 to 80 degrees, and an h/r ratio of the features that is >0.05.

Feature shapes provided by CMF acting on patterned surfaces can be symmetric or non-symmetric (asymmetric/complex) shapes. When a disclosed feature is symmetric, the feature has a single minimum lateral dimension "r". When a disclosed feature is asymmetric and has multiple "r" dimensions, as used herein the minimum lateral dimension "r" is the smallest of $r_1, r_2, \ldots$ values.

If the features are symmetric, such as a pyramid which is a triangle in 2 dimensions, then h varies over a total lateral distance of "2r". If the symmetric feature includes a planar top, the lateral distance traversed by the planar top does not contribute to the r value since h is constant at the top of the features. If the feature shape is an asymmetric/complex shape, then total dimension for the features is the sum of two or more different r values, such as $r_1+r_2$, $r_1+r_2+r_3$. It is noted that "h" can also be different values (though only $h_1$ having one value is shown). For different values of "h" in a structure, the largest value of "h" is considered.

As described above, the h/r ratio of the features for disclosed embodiments is generally ≧0.05. The tilted surface features provided by CMF processing according to embodiments of the invention thus opens new applications including a surface shaping process, and devices and articles therefrom.

The patterned substrates and surfaces can comprise a wide variety of materials. Exemplary materials for the patterned surface can comprise glass, SiC, GaN, carbides, nitrides, sapphire, oxides, an optically transparent electrically conducting oxide, and phosphors. Features formed by CMF as described herein, as with CMP, do not change the surface composition on the outer surface of the features formed. Thus, the composition of the outer surface and the sub-surface defined herein to begin 1 nm below the outer surface of the feature both have same composition. In contrast, features formed by reactive ion etching (RIE) are known to have an outer surface that due to chemical reaction during the RIE process form features having an outer surface composition that is different from the subsurface composition.

Features formed by CMF also do not create microstructural damage such as scratches, dislocations, amorphization of the surface, surface pits, chemical etch defect delineation. Thus the microstructural quality of the surface is same or better as the sub-surface region. Techniques such as RIE can cause pits and defects e.g. amorphization in the surface thus altering the surface and subsurface microstructure from the bulk. The CMF formed surface may exhibit atomically terraced surface in single crystal material such as but not limited to GaN, Sapphire, AlN. Such features are not observed by RIE method.

The tilted surface portion formed can be either a planar surface having a tilt or a non-planar (curved) surface. For a planar surface, the tilt angle with respect to the substrate surface is constant (e.g. see FIG. 2C), while for a curved surface (e.g. see FIG. 2E), the tilt angle is a variable and may vary from zero degrees to 90 degrees as defined by the angle of its projection to the substrate, which would be a flat substrate surface in the case of a hemisphere. In the case of a curved surface, the radius of curvature of the curved surface feature is generally 10 nm to 5,000 microns. In another embodiment, the structure formed can be a combination of a fixed tilt angle portion from 3 degrees to 85 degrees, and a variable tilt angle portion from zero to 90 degrees.

The material removal rate during conventional CMP depends on process parameters including the applied pressure, linear velocity, the characteristics of the polishing medium (pad and slurry), and the wafer material. Among these, applied pressure and the properties of the pad are the only parameters which generally significantly affect the contact pressure during CMP. Material removal at any location on the wafer is generally directly proportional to the contact pressure.

The Inventors have recognized that while contact pressure is uniform for a featureless flat wafer, for a wafer with high and low elevation features it can vary significantly along the area of the wafer. The Inventors have recognized that bringing together the polishing pad with appropriate stiffness characteristics and a wafer under an applied pressure for appropriate contact times leads to deformation of the pad along the features on the wafer. This variation in contact pressure and hence removal rate is used by a first embodiment of the invention to enable CMF to form articles having various feature shapes. As described below, the polishing contact times are outside the boundaries of processing times in which a polished surface can be considered to be a planar surface.

CMF methods forming articles having tilted surface features can comprise providing a substrate having a patterned surface comprising at least one protruding or recessed feature. The protruding or recessed feature comprises a first composition, having a pre-CMF high portion and a pre-CMF low portion, wherein a vertical distance (height) between the pre-CMF high portion and pre-CMF low portion is ≧10 nm, and the pre-CMF high portion (e.g. top of the feature) includes a center portion and an edge portion.

The center portion and edge portion of the pre-CMF high portion of the protruding/recessed feature(s) are contacted with a polishing pad having a slurry composition therebetween. The contact pressure at the center portion is lower than the edge portion. The slurry composition is moved relative to the protruding/recessed feature, wherein the edge portion polishes at a faster polishing rate as compared to a polishing rate of the center portion to form at least one tilted surface feature. The tilted surface feature comprises at least one surface portion having a surface tilt angle from 3 to 85 degrees and a surface roughness <5 nm rms. The surface roughness can be <2 nm rms, such as <1 nm rms. One exemplary tilted surface feature shape is a microlens (see FIG. 2L).

The time to create tilted surface feature(s) according to an embodiment of the invention can be estimated from the time to reach planarization. FIG. 1A shows a plot of the high and low (or peak to valley) height ($R_{pv}$) of the feature(s) as a function of processing time that defines the two (2) CMF zones relative to CMP along with a cross sectional depiction of the resulting structure process as time proceeds (dashed lines), according to an embodiment of the invention. The features polished using CMF can be single layer structures, or multiple layer structures (e.g., copper over a damascened dielectric layer).

FIG. 1A demonstrates that the polishing times (t) for CMF can be $t<t_0$, or $t>t_1$. $t<t_0$ is before planarization and is termed "under-polish" for a CMP process and $t>t_1$ is after planarization, which represents "over-polish" for a CMP process. As described above, a planarized surface is defined as h/r<0.01. $R_{pv}$ can be seen to be greater than 10 nm in both CMF time regimes, and <10 nm for conventional CMP processing. In the under-polish regime, $R_{pv}$ decreases from its initial value provided that is based on the feature height formed as the CMF process proceeds. In the over-polish regime, dishing occurs to render the substantially planarized structure obtained from the CMP time regime to have an increasing $R_{max}$ as the polishing time proceeds due to increased dishing which occurs when the two or more surface compositions are being polished simultaneously (feature material different from substrate material). However, if the surface comprises a single surface compositions (feature material the same as the substrate material), the surface generally remains planar during overpolish and is thus not generally useful for forming tilted surface features.

Figure 1B:
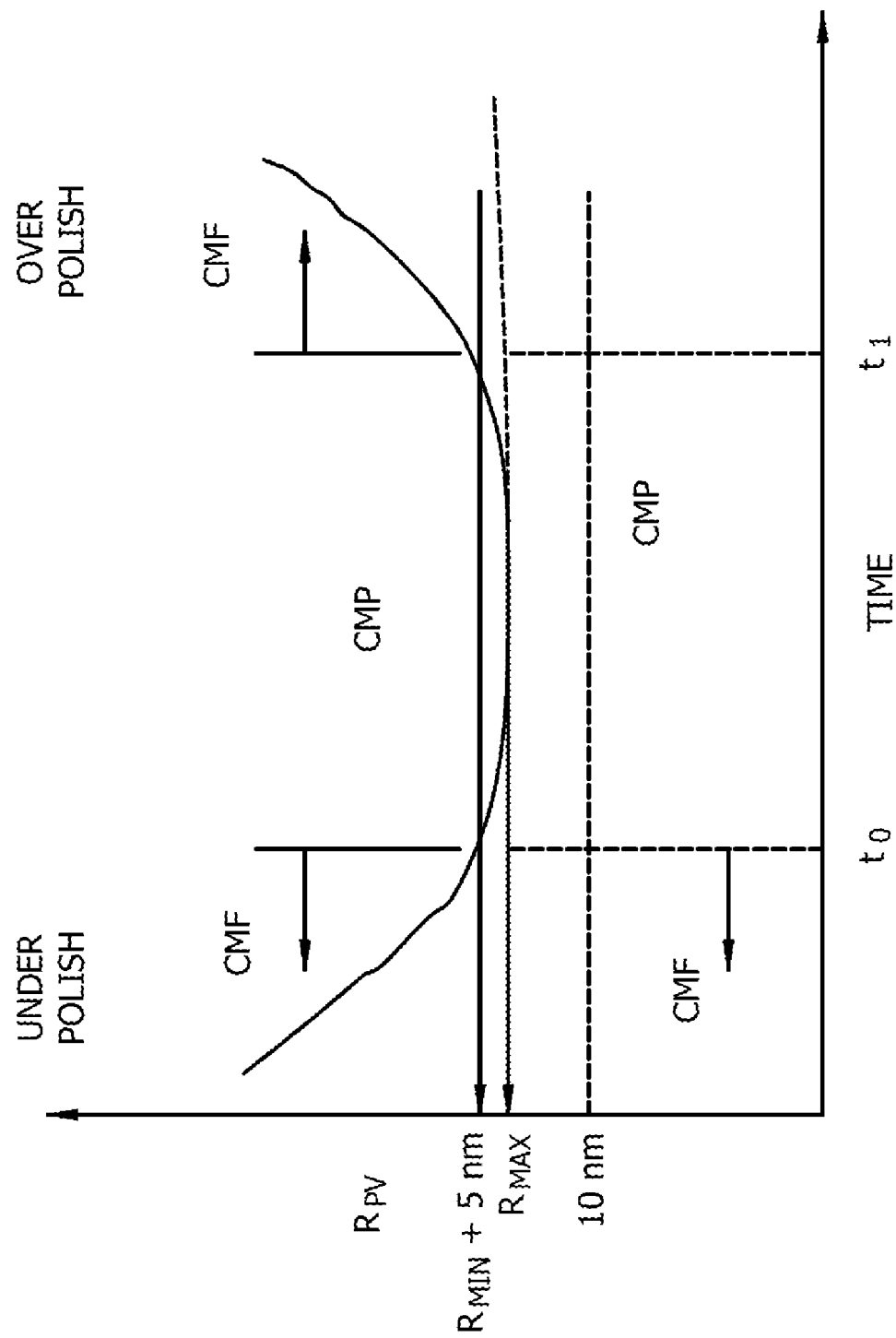
FIG. 1B shows a plot of $R_{pv}$ as a function of polishing time that defines the CMF time zones relative to CMP, for the embodiment where the value of the minimum ($R_{pv}$ does not reach below 10 nm.

In another variant of this embodiment, the height difference between the high and low portions of the features after polishing may not reach the planarization zone value (defined as the height difference between high and low portion of the features being less than 10 nm). FIG. 1B shows a plot of the high-low portion of the features as a function of polishing time that defines the CMF zones relative to CMP in the embodiment where the minimum $R_{pv}$ values do not reach below 10 nm. In such a case the CMP zone is defined by polishing times when the surface has a height with $R_{min}+2$ nm, where $R_{min}$ is defined herein as the minimum height difference between the high and low portions reached during the polishing process. The time to enter planarization zone (denoted by CMP) is again defined as $t_o$. If the surface does not include two dissimilar polishing surface compositions, (single composition surface for substrate and features), the article can be expected to remain in the CMP zone for the duration of the polishing process. If the polishing surface is composed of dissimilar materials of two or more different composition having different polishing rates, new topographies are expected to be created because of this effect. In this case the height difference between the high and low portions of the features generally again exceed 10 nm and the material is expected to become deplanarized.

The time when the material exits the CMP zone is shown in FIG. 1B as $t_1$. The fabrication of the articles by this embodiment in this regime occurs for $t>t_1$. Typically, the fabrication of the articles utilize polishing times less than $t_o-1$ seconds, or greater $t_1+1$ second. The polishing times can be less than $t_o-3$ seconds or greater $t_1+3$ seconds. In another embodiment the polishing time is less than $t_o-6$ seconds or greater $t_1+6$ seconds. In other embodiments, the polishing time is between zero and $t_o-1.5$ seconds, or between $t_1+6$ seconds and $t_1+250$ minutes. In some applications it is desirable to have a low surface roughness and reduced sub-surface damage. Known methods for creating curved or tilted surfaces, include reactive ion etching (RIE) through an etch mask, chemical etching through an etch mask using appropriate chemicals, or etching with a laser or partial cutting using a mechanical saw such as wire saw. Other known methods include ion beam etching through a mask, focused ion beam patterning. These techniques are suited to provide vertical-like surface features, with limited ability to develop tilted surfaces. These techniques all typically create higher surface roughness >3 nm rms for single crystal, polycrystalline and amorphous materials. RIE, mechanical sawing or laser cutting also create significant subsurface damage that can extend at least 10 nm or more below the surface. Sub-surface damage is defined as displacement of atoms from their original position as a result of external processing to pattern the substrate. The amount of surface damage and surface roughness typically increases as the process time is extended. In contrast, embodiments of the embodiments do not create any measurable sub-surface damage (maximum within 5 nm), and typically remove the damage caused by other processes. The sub-surface damage can be measured by techniques such as grazing angle X-ray diffraction and cathodoluminescence (CL) techniques.

In one embodiment, RIE together with a lithographically printed pattern is used to form the patterned pre-CMF surface. By etching near vertical walled trenches for depths greater than several microns, RIE is known to be capable of forming vertical-walled (nearly 90 degrees relative to the substrate surface) protruding features, with the high portions corresponding to the non-etched region and the low portions being the etched trench or via region. Such vertical or near vertical walls can be created by several techniques besides RIE as described above. The height of the features can generally vary from 50 nm to 1,000 microns, while the lateral dimension of the features can generally vary from 50 nm to 2,000 microns.

The patterned surfaces can comprise metal, ceramic, insulator, semiconductor, polymer or comprise a biological material. Specific examples include, metallic materials (e.g., Mo) and metal alloys such as steel, transparent conducting oxides such as indium tin oxide (ITO), other oxides, sulfides, tellurides, other insulators or semiconductors such as III-V materials (such as GaAs, GaN, AlN), Group IV semiconductors (such as Si, SiC, Ge, SiGe), II-VI materials (such as ZnS, ZnSe, ZnTe), Ta, GaN, $SiN_x$, $SiO_x$, $SiO_xN_y$, Sapphire, alumina, $TiO_2$, ZnS, $Ta_2O_5$, glass, steel, Mo, ZnO, tin oxide, CdTe, CdS, silicon, Copper Indium Gallium Selenide (CIGS), phosphors composed of oxides, spinels, gallates and sulfides, polymers such a PMMA, polystyrene, polycapralactone, polylactic acid/polygalactic acid. The materials system can be composites or mixtures and can also have recessed or damascene structures similar to formation of copper interconnects in silicon based devices. The materials system can have layers of different composition below the surface layers The materials described above represent only a small number of solids and the scope of embodiments of the invention are not limited to the materials described above.

The pressure used in the CMF process can generally vary from 0.1 psi to 50 psi. More typically, the pressure during CMF can vary from 1 psi to 20 psi, such as 2 psi to 15 psi. The linear velocity during CMF can generally vary from 0.001 m/sec to 50 m/sec, such as 0.01 ms/sec to 5 m/sec, typically 0.1 m/sec to 2 m/sec. The pads used can vary from soft pads to hard pads. Examples of pads includes Politex and Suba IV, IC 1000 pads made by Rohm and Haas Company, Delaware D100 pads made by Cabot Microelectronics, Illinois. Other example includes pad made of natural and manmade materials such as wool, cloth. Typically higher curvatures can be achieved by a softer pad, where as smaller curvatures can be obtained by a harder pad. The temperature for CMF can generally vary from 0° C. to 150° C., such as around room temperature (25° C.). At higher temperatures compared to room temperature the polish rates may be higher which may be desirable for the fabrication process. Also at higher temperatures the mechanical polishing pad becomes softer which may lead to higher curvature structures.

The polish rate used for CMF according to embodiments of the invention can vary from 0.1 nm per minute to 20 microns/min, such as 1 nm/min to 1 micron/min. The polish rate can be controlled by the chemistry of the slurry and the polishing parameters (velocity, pad, pressure) of the polishing tool. The slurry chemistry for the CMF process may comprise several chemicals and/or abrasives. The chemicals can include oxidizers, surfactants, salts, biocides, pH buffering agents, and chelating agents. The particles can include abrasives such as silica, ceria, titania, diamond, alumina, silicon nitride, diamond, zirconia, yttria, and non soluble oxides and compounds of transition metals. Coated and uncoated particle can generally be used. The concentration of the particles can generally vary from 0.001 to 50 weight percent. The size of the particles can generally vary from 0.5 nm to 1 mm. In one embodiment the particle size ranges from 20 nm to 50 microns.

The particles mentioned above represent only exemplary particles and the scope of embodiments of the invention are not limited to the particles disclosed herein. The surfactants used can generally be cationic, anionic or non-ionic. The particles and the chemicals dispersed in the slurry can be organics or aqueous liquid or mixtures thereof.

The polishing composition generally comprises oxidizing agents, which can be suitable for one or more materials of the substrate to be polished. The oxidizing agent can be selected from cerium ammonium nitrate, potassium persulfate, potassium peroxy monosulfate, halogens, $H_2O_2$, oxides, iodates, chlorates, bromates, periodates, perchlorates, persulfates, phosphates and their mixtures thereof, such as sulfates, phosphates, persulfates, periodates, persulfates, periodates, perchlorates, chromates, manganates, cynanides, carbonates, acetates, nitrates, nitrites, citrates of sodium, potassium, calcium, magnesium. The oxidizing agent present in the polishing composition can generally be $\geq 0.001$ wt %.

The pH of the polishing composition can generally vary from 0.5 to 13.5. The actual pH of the polishing composition will generally depend, in part, on the type of the mixture and type of the feature materials polished. The pH of the composition can be achieved by a pH adjuster, buffer or combination thereof. The pH can generally be adjusted using any organic or inorganic acid and organic or inorganic base.

The polishing composition can comprise a chelating or complexing agent such as aldehydes, ketones, carboxylic acid, ester, amide, enone, acyl halide, acid anhydride, urea, carbamates, the derivatives of acyl chlorides, chloroformates, phosgene, carbonate esters, thioesters, lactones, lactams, hydroxamates, isocyanates, alcohols, glycolates, lactates. The complexing agent is any suitable chemical additive that can remove the metal contaminants and enhance polishing rates. The chelating agents can be of Acrylic polymers Ascorbic acid, BAYPURE® CX 100 (tetrasodium iminodisuccinate), Citric acid, Dicarboxymethylglutamic acid, Ethylenediaminedisuccinic acid (EDDS), Ethylenediaminetetraacetic acid (EDTA), Hepta sodium salt of diethylene triamine penta (methylene phosphonic acid) ($DTPMP.Na_7$), Malic acid, Nitrilotriacetic acid (NTA), Nonpolar amino acids, such as methionine, Oxalic acid, Phosphoric acid, Polar amino acids, including: arginine, asparagine, aspartic acid, glutamic acid, glutamine, lysine, and ornithine, Siderophores such as Desferrioxamine B, Succinic acid, benzotriazole, (BTA), tartrates, succinates, citrates, phthalates, carboxylates, amines, alcohols, malates, edetates, thereof.

The slurry composition can comprise salts that can be formed from the organic or inorganic acids & bases. Salts can comprise cations such as ammonium $NH_4^+$, calcium $Ca^{2+}$, iron $Fe^{2+}$ and $Fe^{3+}$, magnesium $Mg^{2+}$, potassium $K^+$, Pyridinium $C_5H_5NH^+$, Quaternary ammonium $NR_4^+$, sodium $Na^+$, copper and anions such as acetate $CH_3COO^-$, carbonate $CO_3^{2-}$, chloride $Cl^-$, chlorate, perchlorate, bromide, iodide, fluoride, periodates, citrate $HOC(COO^-)(CH_2COO^-)_2$, cyanide $C\equiv N^-$, Hydroxide $OH^-$, Nitrate $NO_3^-$, Nitrite $NO_2^-$, Oxide $O^{2-}$ (water), Phosphate $PO_4^{3-}$, Sulfate $SO_4^{2-}$, and pthalates.

In another embodiment of the particle or insoluble material content of the slurry composition is less than 0.01 weight percent. Besides the oxidizers, surfactants, salts, biocides, pH buffering agents, chelating agents described above, the slurry composition can comprise other chemical agents used in abrasive based slurries as known in the art. The CMF surface can be further treated to clear the surface from particles, chemicals etc. The chemicals can also be used to chemically further etch the surfaces.

The non-planar or tilted surface feature generally has an h/r ratio greater than 0.05, such as greater than 0.1, or greater than 0.20. The minimum lateral size r of the non-planar or tilted surface features is greater than 50 nm or greater than 500 nm, such as greater than 5 microns. Surfaces of both positive and negative curvature and mixed curvature can also be fabricated. The shape of the structures formed by processes according to embodiments of the invention can be of many generic shapes including microlens, hemispherical, truncated or full pyramids and cones. The feature-to-feature distance between the non-planar or tilted surface features can generally vary from 100 nm to 1,500 microns (1.5 mm).

Figure 2A:
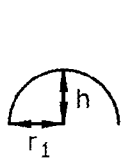
FIGS. 2A-P show examples of tilted surface features that can be fabricated by CMF methods according to embodiments of the invention including symmetric surfaces (A-E), asymmetric surfaces (F-J), negative curvature surfaces (K), with FIG. 2K being further identified as an article comprising a plurality of recessed and tilted surface features, positive curvature surfaces (L) with FIG. 2L being further identified as an article comprising a plurality of protruding and tilted surface features, mixed curvature surfaces (M), and mixed structures (N-P), respectively.
Figure 2B:
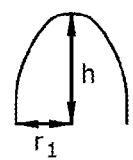
Figure 2C:
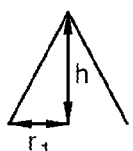
Figure 2D:
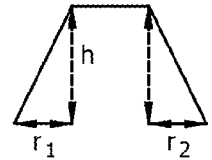
Figure 2E:
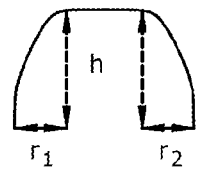
Figure 2F:
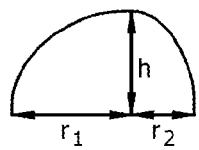
Figure 2G:
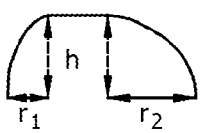
Figure 2H:
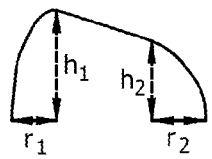
Figure 2I:
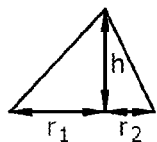
Figure 2J:
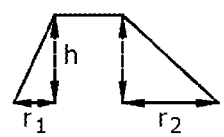
Figure 2K:
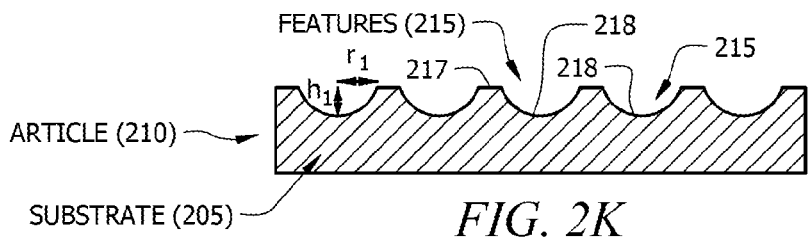
Figure 2L:
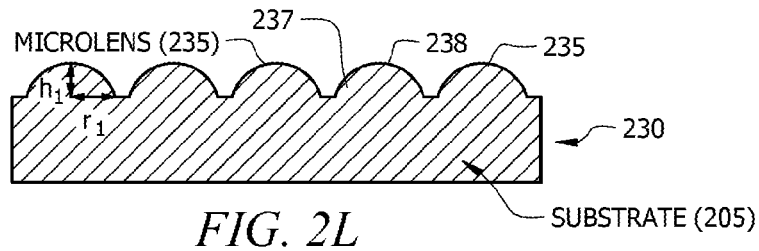
Figure 2M:
Figures 2N, 2O:
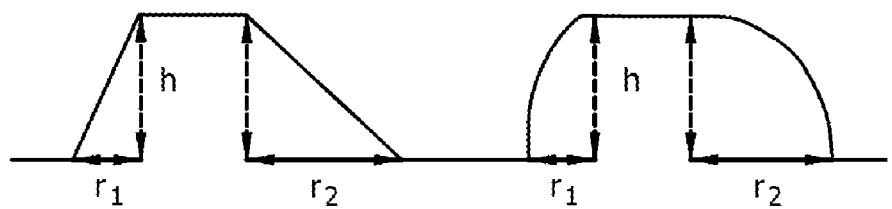
Figure 2P:
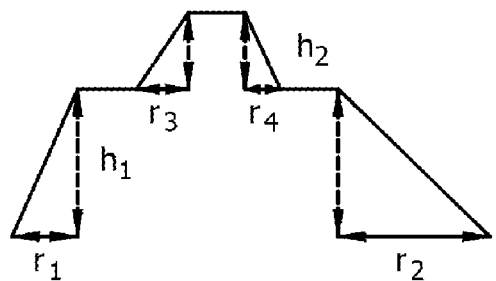

The non-planar or tilted surface feature(s) formed can be defined by their h/r ratios as shown in FIGS. 2A-P. FIGS. 2A-P show examples of tilted surface features that can be fabricated by CMF methods according to embodiments of the invention including symmetric surfaces (A-E), asymmetric surfaces (F-J), positive curvature surfaces (K), negative curvature surfaces (L), and mixed curvature surfaces (M), and mixed structures (N-P), respectively. In each case, at least one of the surfaces have a height (h)>10 nm, a h/r ratio where r is the lateral dimension varying from 0.05 to 1.0, or a tilt angle of curvature between 3 and 85 degrees. The shapes shown in the FIGS. 2A-P represent a small number of possible shapes and the scope of embodiments of the invention are not limited to the shapes shown.

FIG. 2K is identified as an article 210 having tilted surface features shown as a plurality of recessed surface features 215. The article comprises a substrate 205 and a patterned surface comprising a plurality of recessed surface features 215 having high elevation portions 217 and low elevation portion 218 defining a vertical distance shown as $h_2$, and having a lateral dimension (shown as $r_2$), wherein an $h_2/r_2$ ratio is $\geq 0.01$ and at least one of (i) h is $\geq 100$ nm and (ii) a tilt angle of curvature that is between 3 and 85 degrees. The recessed surface features 215 have a surface roughness <10 nm rms, such as <3 nm rms.

FIG. 2L is identified as an article 230 having tilted surface features shown as protruding surface features comprising microlenses 235. Article 230 comprises substrate 205 and a patterned surface comprising a plurality of microlenses 235 having high elevation portions 238 and low elevation portion 237 defining a vertical distance ($h_2$), and having a lateral dimension (shown as $r_2$), wherein an $h_2/r_2$ ratio is $\geq 0.01$ and at least one of (i) $h_2$ is $\geq 100$ nm and (ii) a tilt angle of curvature that is between 3 and 85 degrees. The microlenses 235 have a surface roughness <10 nm rms, such as <3 nm rms.

Figure 3A:
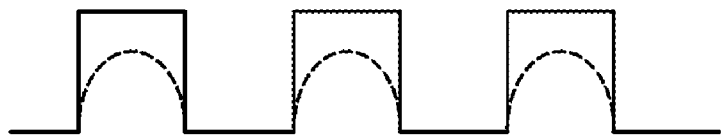
FIGS. 3A-C show some exemplary feature shapes obtainable using the under-polish regime of CMF, according to an embodiment of the invention. The solid lines show the structure as provided, while the dashed lines show the resulting structure as the time for CMF increases.
Figure 3B:
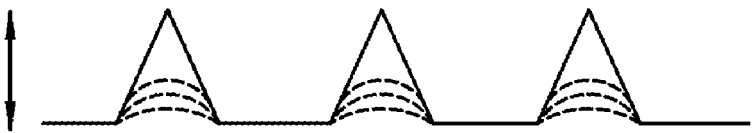
Figure 3C:
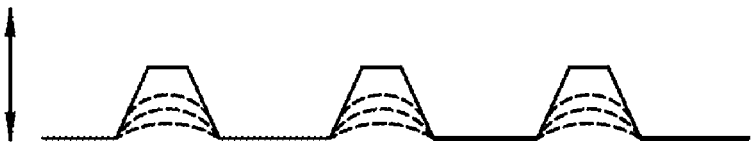

FIGS. 3A-C shows some exemplary feature shapes obtainable using the under-polish regime of CMF, according to an embodiment of the invention. Under-polish corresponds to t<to as shown in FIGS. 1A and 1B. The solid lines show the structure as provided, while the dashed lines show the resulting structure as the time for CMF proceeds (dashed lines).

In another embodiment of the invention, multiple surfaces with different tilt angles can be formed by varying the distance between the patterned structures. For example if the distance between the features is 10 microns in one direction and 20 microns in the other direction, different h/r ratio features can be formed. Features obtained by such methods are referred to herein as asymmetric structures as the h/r ratio and $R_{pv}$ varies with respect to different directions on the surface. As described above, examples of asymmetric feature shapes are shown in FIGS. 2F-J.

In one embodiment of the invention, pressure variation during polishing can comprise forming a polishing stop layer comprising a second composition on a portion of the high elevation portion of the protruding feature before the polishing, wherein the second composition has a removal rate during CMF that is $\leq 0.8$ of a CMF removal rate for the first composition. The ratio of the removal (polishing) rate of the first composition and the second composition (stop layer) is defined as the selectivity for the polishing process. The selectivity can vary from 1.25 to greater than 3,000, such as from 2 to 1,000 or from 10 to 500. The polishing rate for the stop layer can generally vary from 0.001 nm/min to 1,000 nm/min. The polishing rate of the substrate composition can generally vary from 0.001 nm to 20 microns/min. The selectivity of the polishing process can be achieved by controlling the chemical and the mechanical composition of the polishing slurry. To obtain high selectivity the chemical composition and the particle composition can be adjusted so that the removal rate of the stop layer is much lower than that of the substrate layer.

Figure 4:
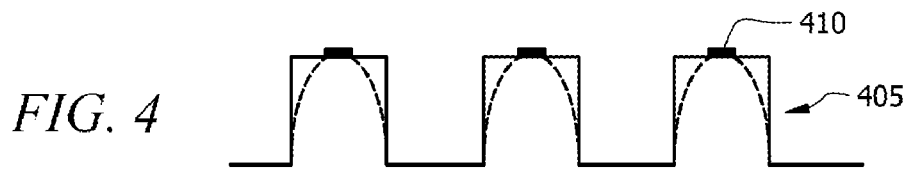
FIG. 4 shows an initial feature profile and a feature profile after CMF (dashed lines) in the embodiment where a polishing stop layer is positioned proximate to the center portion of the high elevation portion of the features, according to an embodiment of the invention.

FIG. 4 shows an initial feature profile (solid lines) and a feature profile after CMF (dashed lines) in an embodiment where a polishing stop layer 410 is positioned proximate to the center portion of the high elevation top portion of the features 405, according to an embodiment of the invention. Such a polishing stop layer 410 can be formed on the features using well known deposition and lithography techniques used in conventional IC fabrication. The removal rate of the polishing stop layer 410 is typically less than the removal rate for the material comprising the features 405. Typically, the polishing removal rate of the stop layer 410 is $\leq 0.5$ of a polishing removal rate for the material comprising feature 405. In this case the use of the polishing stop layer 410 results in the creation of tilted surfaces that are not in a shape of a microlens. Some of the feature shapes that can be obtained by the use of a stop layer 410 are, for example, include a truncated microlen, a conical structure, and a truncated cone.

As the polishing selectivity is increased to a value higher than 1.0 (for example, in the range from 2 to 5,000) and the stop layer 410 is patterned to have dimensions smaller than the protruding features 405, the CMF method can be used to increase the h/r ratio of the resulting structures. The h/r ratio of the structure can be increased from 0.01 up to 1.0 by changing and controlling the dimensions of the stop layer 410, the thickness of the stop layer and the selectivity of the stop layer relative to the material in feature 405. This embodiment can also be used to increase the tilt angle of the structure.

The tilt angle can be increase from 3 degrees to 85 degrees depending on the dimensions, thickness and the polishing selectivity of the stop layer relative to the material of feature 405.

Furthermore, this embodiment can change the shape of the feature from that of a microlens to a truncated cone-like structure. This typically happens when the dimensions of the stop layer varies from 95% to 0.001% of the area of the top of the protruding features 405. To achieve an increase in tilt angle and a higher h/r ratio, an increase in selectivity is generally desirable. If during the CMF process the edges of the polishing stop layer 410 are polished, both positive and negative curvature structures can be formed.

Another related method to achieve selective polishing according to another embodiment of the invention is to deposit particle based non-continuous coatings on the surface of the substrate. The particles act as selective mask layers for the CMF process. In such a case, no lithographic pattern is generally needed. The size of the particles can generally vary from 1 nm to 100 microns while the surface coverage of the particles can vary from 0.01% to 60%. The particles can be adhered to the surface by heating so that reaction bonding can take place. The particles can comprise metals, ceramics, polymers or composite materials and their alloys, or mixtures thereof.

Figure 5:
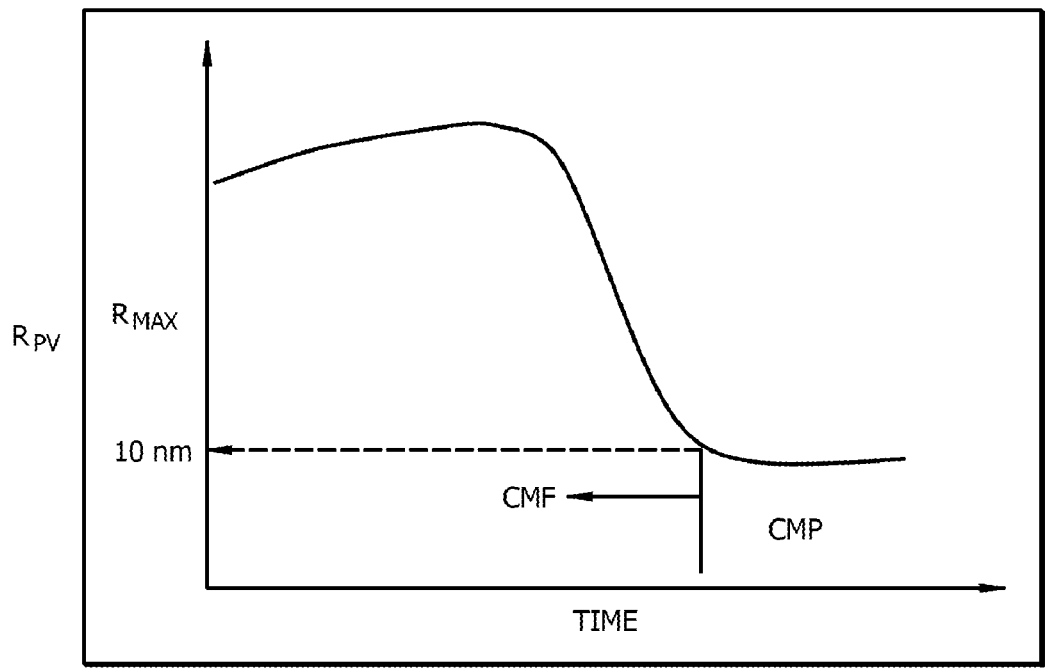
FIG. 5 shows a plot of $R_{pv}$ as a function of processing time that defines the CMF zones relative to CMP for the polishing stop layer comprising embodiment, according to an embodiment of the invention.

FIG. 5 shows a plot of the peak to valley height ($R_{pv}$) as a function of polishing time that defines the CMF zones relative to CMP for the polishing stop layer comprising embodiment, according to an embodiment of the invention. The steep decrease in $R_{pv}$ during CMP is obtained when the polishing stop layer has been slowly polished away which leads to the polishing of the entire feature, resulting in a sharp decrease in the $R_{max}$ value.

Figure 6A:
FIGS. 6A and B show an initial feature profile (solid lines) and a feature profile after CMF for various times (dashed lines) in the embodiment where polishing stop layer is positioned proximate to an edge portion of the top of the features, according to an embodiment of the invention As shown, this embodiment creates asymmetric features.
Figure 6B:

In another embodiment of the invention the polishing stop layer is positioned proximate to an edge portion on the top of the features. FIGS. 6A and B show an initial feature profile (solid lines) and a feature profile after CMF for various times (dashed lines) in the embodiment where polishing stop layer is positioned proximate to an edge portion of the top of the features, according to an embodiment of the invention. As shown, this embodiment creates asymmetric features.

Another embodiment of the invention comprises a CMF method for forming articles having curved and tilted features that is based on polishing selectivity. If the surface includes two (or more) different materials that have different polishing rates on its surface, such as a first material on one portion of the surface and a second material on another portion of the surface, the polishing slurry can be designed (e.g., using suitable chemistry) by having a high relative polishing selectivity to one of the materials (e.g., the first material) relative to the other material (e.g., the second material). Thus, the first material will polish faster than the second material. In one embodiment, an etch mask can be formed to provide the lower polishing rate to achieve non-planar polishing.

A first disclosed solid state light source embodiment comprises a method for forming a solid state light source that comprises providing a substrate having a patterned surface comprising a plurality of pre-CMF protruding or recessed features. The pre-CMF protruding or recessed features comprise a first composition that have a pre-CMF high portion and a pre-CMF low portion. A vertical distance (height) between the pre-CMF high portion and pre-CMF low portion is $\geq$10 nm. The pre-CMF high portion includes a center portion and an edge portion.

The pre-CMF high portion is contacted with a polishing pad having a slurry composition therebetween. The slurry composition is moved relative to the protruding or recessed features to polish the center and edge portion, wherein the edge portion polishes at a faster polishing rate as compared to a polishing rate of the center portion to form a plurality of tilted surface features. The tilted surface features formed comprise at least one surface portion having a surface tilt angle from 3 to 85 degrees and a surface roughness <10 nm rms, such as <3 nm rms. The tilted surface features also has a post-CMF high elevation portion and a post-CMF low elevation portion that defines a height (h), wherein the tilted surface feature defines a minimum lateral dimension (r), and h/r of the feature is $\geq$0.05.

A second disclosed solid state light source embodiment comprises a method for forming a solid state light source using a CMF process on a planar or at least substantially planar surface. The substantially planar surface is characterized by a pre-CMF high portion to pre-CMF low portion that is <10 nm. The surface has first regions comprising a first composition and second regions comprising a second composition different from the first composition, wherein the second composition has a polishing removal rate $\leq$0.5 of a polishing removal rate of the first composition. A patterned polishing stop layer on the substrate can be used to provide the differential polishing rate. As with the first solid state light source method embodiment described above, following CMF, the tilted surface features formed comprise at least one surface portion having a surface tilt angle from 3 to 85 degrees and a surface roughness <10 nm rms such as <3 nm rms, a post-CMF high elevation portion and a post-CMF low elevation portion that provides a feature h/r of $\geq$0.05.

The CMF derived features have h dimensions that generally varies from 10 nm to 1 mm, and r dimensions that varies from 10 nm to 1 mm and an h/r ratio varying from 0.05 to 1.0. The tilted surface features provided by CMF processing according to embodiments of the invention thus opens new applications including a surface shaping process for forming interfaces having tilted surface features, and solid state light emitting devices and articles therefrom.

CMF fabricated solid state light emitting devices according to disclosed embodiments are structurally distinct as compared to conventional solid state light emitting devices having patterned structures at one or more of their interfaces as described above. As known in the art, surface roughness and morphology can be created by many different methods including chemical etching, photochemical etching, and electrochemical etching. Other techniques such as selective laser ablation, RIE and other vapor phase techniques can create surface morphologies such as holes, with a concomitant increase in surface roughness.

The structures fabricated by disclosed embodiments can be characterized and distinguished from conventional structures by two different quantitative surface morphological measures presented herein, one to quantify short range roughness and another to quantify long range order. CMF according to disclosed embodiments reduces short range roughness from application of the CMF method whereas known etching methods increase short range roughness from application of the method. The CMF method also imparts long range order.

For the first method embodiment disclosed herein, long range order can be provided by starting with patterned protruded or recessed features, such as prepared by lithographic methods. For the second method embodiment disclosed herein which comprises selective polishing, periodic structures can be generated by providing patterned structures for CMF processing, such as a patterned (e.g. periodic) polishing stop layer pattern, where the stop layer provides a different removal rate relative to the removal rate of the substrate. Other methods to obtain periodic surfaces according to embodiments of the invention include, but are not limited to, laser drilling, screen printing, micro and a nano imprinting method. In contrast, known feature formation methods do not provide long range order for the features. For example, typical roughness creation methods such as chemical etching, photo electrochemical etching generally do not provide either long range order or short range order for the features formed.

The long range order described herein is quantified herein by a LRQP parameter characterized by a long wavelength $\lambda$ that is $\geqq 200$ nm and the short term roughness by a SRM morphology parameter which has a wavelength $\lambda_{SR}$ that is $\leqq 200$ nm. The SRM morphology generally corresponds to the conventionally defined surface roughness of the surface along the surface of the feature.

LRQP can be quantified by the distribution of feature parameters for a plurality of generally periodic features referred to herein as quasi periodic characteristics that are based on the parameters described above comprising h, $\lambda$ (which is derived from r), or the feature aspect ratio (h/r). As described below, the distribution frequency (number) of the features can be plotted as a function of its quasi periodic characteristics, (e.g., h values, $\lambda$ values or h/$\lambda$ values). The dispersion of these structures with respect to its characteristic mean values can be characterized by the standard deviation ($\sigma$) about a mean (m) value ($h_{1m}$, $h_{2m}$, $h_{3m}$, $\lambda_{1m}$, $\lambda_{2m}$, $\lambda_{3m}$, $h_{1m}/\lambda_{1m}$) for each specific quasi periodic characteristic, where $\sigma$ is the standard deviation. The ratio of the standard deviation to its characteristic parameter mean (e.g., $h_{1m}$, $h_{2m}$, $h_{3m}$, $\lambda_{1m}$, $\lambda_{2m}$, $\lambda_{3m}$, $h_{1m}/\lambda_{1m}$) is defined as the LRQP distribution ratio that can be used to characterize the long range order (periodicity) of structures comprising a plurality of tilted surface features disclosed herein.

A structure including a patterned surface having a feature distribution wherein at least one LRQP distribution ratio is less than 0.5 (ratio of $\sigma$ to the mean (m) of characteristic value) can be characterized as the LRQP of a solid state lighting article according to a disclosed embodiment. If the ratio is less than 0.25 it can be classified as highly LRQP, and if the value is less than 0.1 it can be classified has very highly LRQP. These measurements are generally valid for areas that are at least 10 times the area of the feature/structure. For smaller areas, the total frequency of the periodic structures may not be sufficient to reach any statistically significant conclusions.

In the short range, the SRM parameter is characterized by random large peak to valley wavelengths distribution, large distribution of wavelengths ($\sigma$>0.5), and large distribution of the $R_z/\lambda$ ratios. Furthermore, the surface roughness can be characterized by the rms values. The root mean square (rms) roughness of the SRM rms roughness is generally less than 10 nm, such less than 5 nm, less than 2 nm, than 1 nm, and in some cases less than 5 A.

FIGS. 7A-E show exemplary feature shapes for tilted surface features having components defined for the LRQP parameter for several exemplary structures formed by CMF, according to disclosed embodiments, while FIG. 7F shows components for SRM from an exemplary structure formed by CMF showing $\lambda_{SR}$. A plurality of such features are used to form patterned surfaces that can be used for engineered interfaces as described herein, such as to reduce the intensity of substrate and/or active layer modes for a variety of solid state light sources.

Figure 8A:
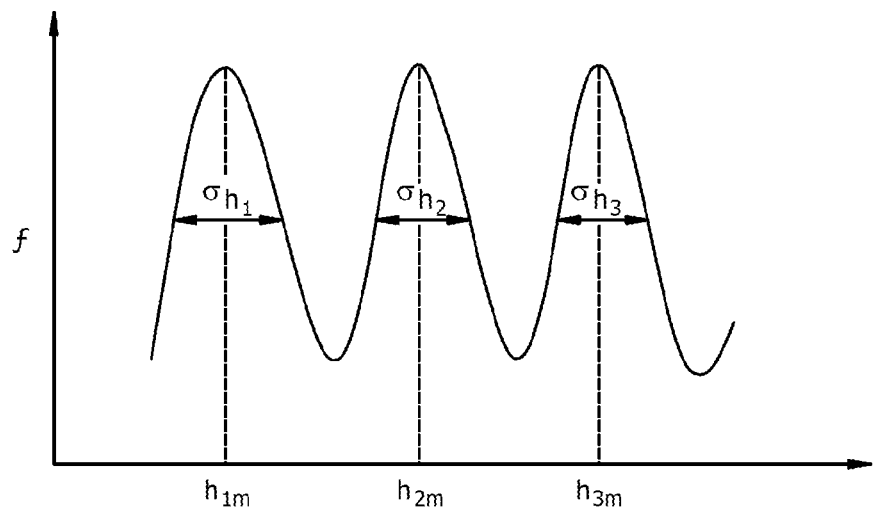
FIGS. 8A-C shows exemplary distribution frequencies (numbers) of tilted surface features plotted as a function of their quasi periodic characteristics, according to a disclosed embodiment (e.g., h values, λ values or h/λ values).
Figure 8B:
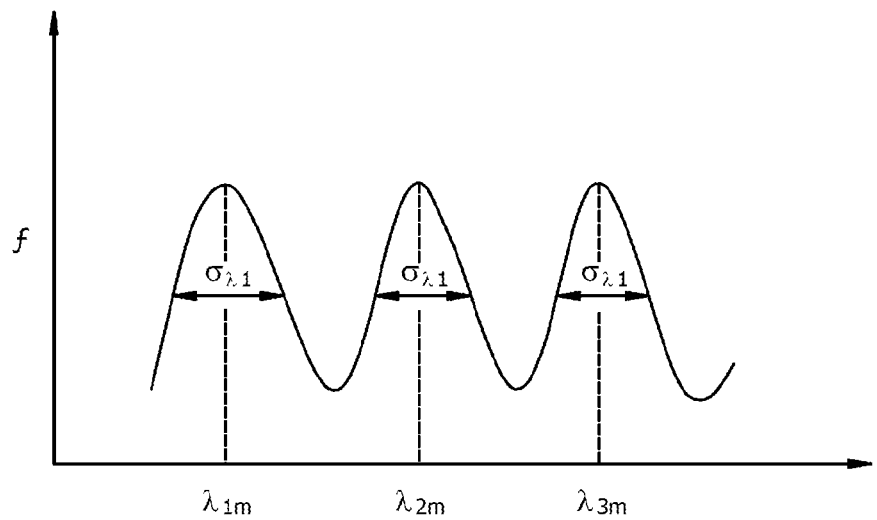
Figure 8C:
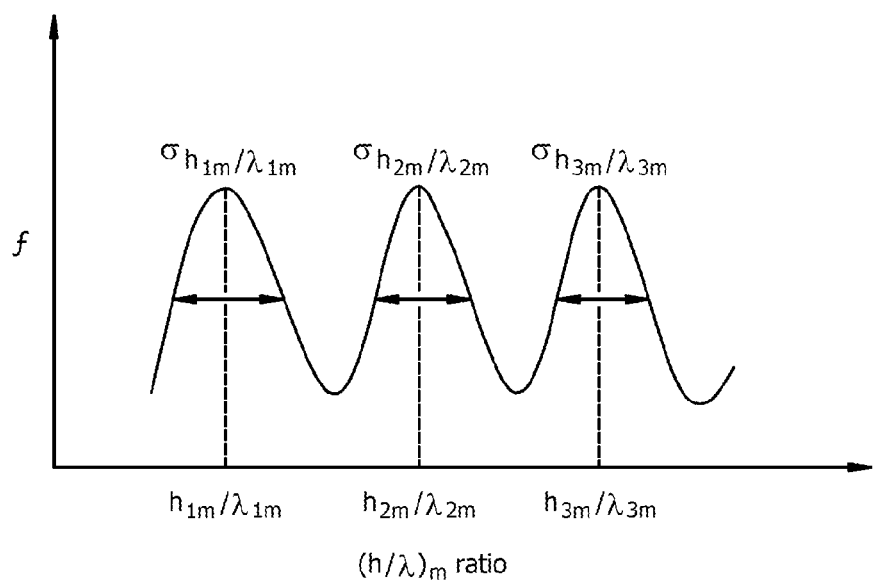

FIGS. 8A-C show exemplary distribution frequencies (numbers) for tilted surface features plotted as a function of its quasi periodic characteristics, (e.g., h values, $\lambda$ values or h/$\lambda$ values). As described above, the dispersion of these structures with respect to its characteristic mean values can be characterized by its standard deviation ($\sigma$) about its mean (m) value, $h_{1m}$, $h_{2m}$, $h_{3m}$ in FIG. 8A, $\lambda_{1m}$, $\lambda_{2m}$, $\lambda_{3m}$ in FIG. 8B and $h_{1m}/\lambda_{1m}$, $h_{2m}/\lambda_{2m}$, $h_{3m}/\lambda_{3m}$ in FIG. 8C, where $\sigma$ is the standard deviation. The ratio of the standard deviation $\sigma$ to its characteristic parameter mean (m) defined as the LRQP distribution ratio can be used to characterize the long range order (periodicity) of structures comprising a plurality of tilted surface features according to disclosed embodiments.

Disclosed embodiments include application of CMF and other processes to engineer different interfaces having tilted surface features in solid state devices to out-couple, one or both the substrate and active layer modes. CMF-based approaches for interface engineering an help in both extraction of photons from different modes and improvement in the crystalline quality of the active layer that is generally epitaxially grown on the substrate. FIGS. 9A-F described below show cross section depictions of structures including engineered interfaces comprising a plurality of titled surface features that are suitable for solid state light sources, according to disclosed embodiments. The solid state light source can comprise, for example, a light emitting diode (LED), an organic-LED, vertical-cavity surface emitting laser (VC-SEL), a quantum dot-based device, a phosphor, or a electroluminescent (EL) device.

The substrate to active layer interface is referred to herein as Interface 2, while the substrate to ambient (e.g. air) interface is referred to herein as Interface 1. A specific challenge in the engineering of Interface 2 arises because the surface of the substrate is generally used for the epitaxial growth of an active layer. Conventional methods used from enhancing light extraction from solid state devices including surface roughening and patterning, create difficulties for the growth of the active layer. In contrast, CMF-based approaches for interface engineering described herein help in both extraction of photons from the active layer mode and improvement in the quality of the active layer. As described below, to improve Interface 2, a patterned surface comprising a plurality of inverted-microlens, micro-pyramids and other tilted surface features on the substrate surface can be created before growth of the active layer.

Figure 9A:
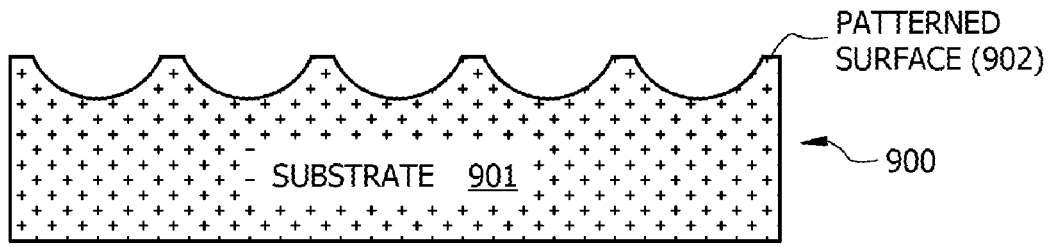
FIGS. 9A-F show cross section depictions of structures including engineered interfaces comprising titled surface features that are suitable for solid state light sources, according to disclosed embodiments.

For example, FIG. 9A shows a cross section depiction of a structure 900 including an engineered interface provided by a patterned surface 902 comprising a plurality of tilted surface features that is suitable for solid state light sources, according to disclosed embodiments. Structure 900 comprises a substrate 901 having a patterned substrate surface 902 that defines a plurality of inverted microlens shaped features, which as described above can be created by CMF processing. Features such as inverted microlenses may also be created using etching solutions or using processes including selective defect etching, but unlike these processes CMF does not create surface roughness, contamination or sub-surface damage.

Figure 9B:
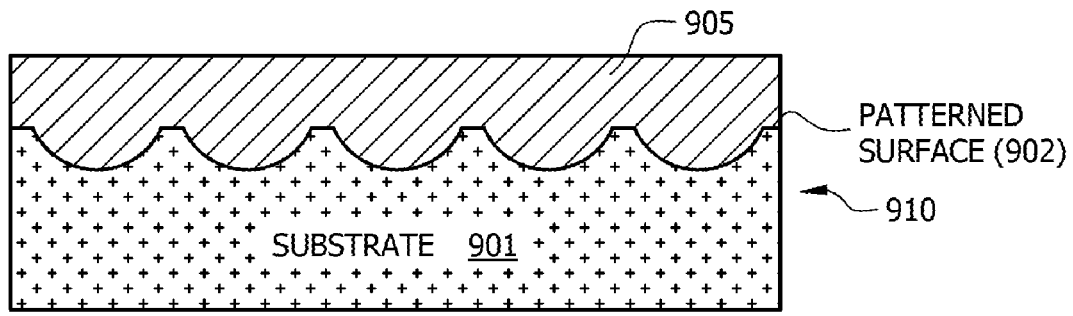
Figure 9C:
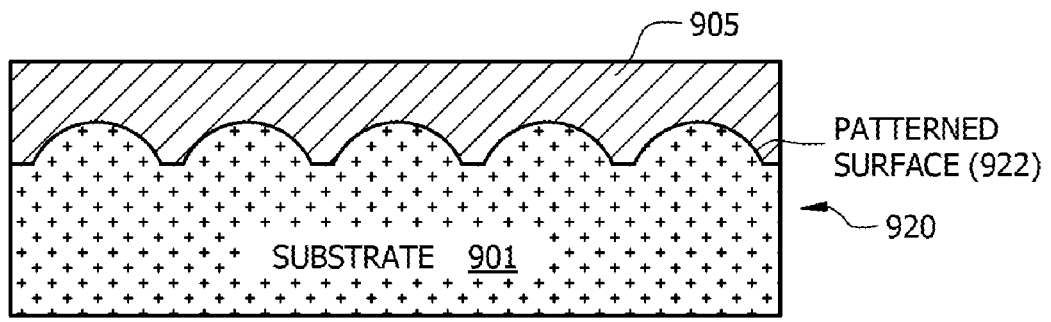
Figure 9D:
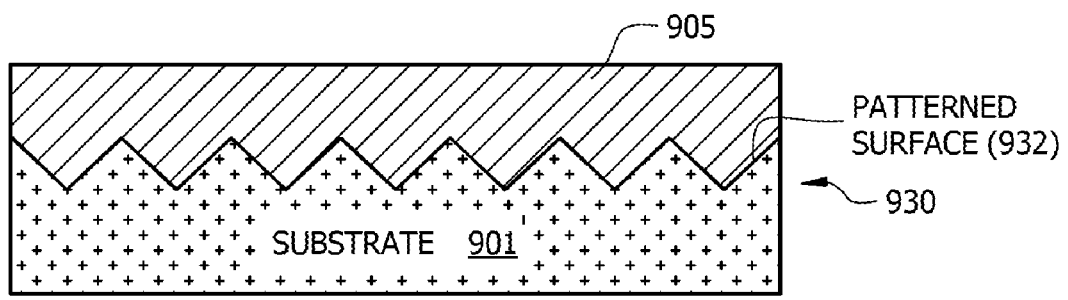

FIG. 9B shows a cross sectional depiction of a structure 910 comprising a buffer layer or an active layer 905 on the patterned substrate surface 902 shown in FIG. 9A, according to a disclosed embodiment. The buffer layer or optically active layer 905 is shown formed directly (i.e. no intervening layers) on the patterned surface 902. FIG. 9C shows a cross sectional depiction of a structure 920 including an active layer 905 on a patterned substrate surface 922 comprising a plurality of microlenses that can be used to form solid state devices including an active laser, while FIG. 9D shows a cross sectional depiction of a structure 930 comprising an active layer 905 on a patterned substrate surface 932 comprising micropyramid shaped features that can be used to form solid state devices, according to disclosed embodiments.

Figure 9E:
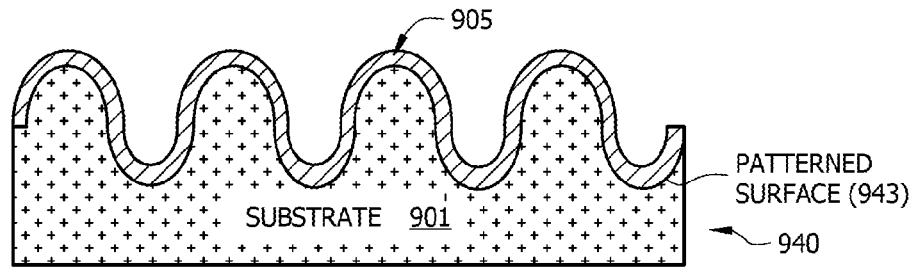

FIG. 9E shows a cross section of a structure 940 comprising a buffer or active layer 905 on the patterned substrate surface 943. The thickness of the buffer/active layer 905 is less than the height of the surface feature shown in FIG. 9E giving rise to a non-planar buffer/active layer 905. When buffer/active layer 905 is embodied as an active layer 905, the active layer can comprise a quantum well, quantum dots, a pn junction, a laser medium, phosphor, electroluminescent, or a cathodoluminescent material.

Figure 9F:
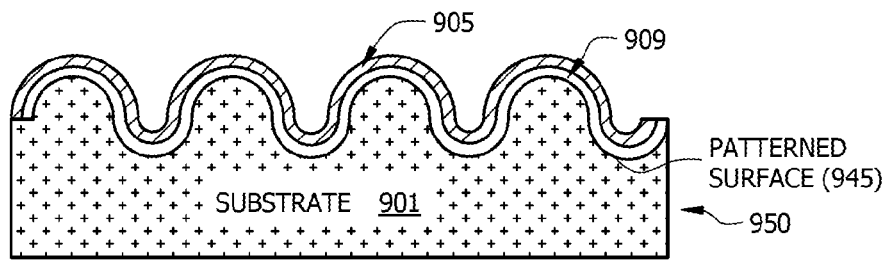

FIG. 9F shows a cross section of a structure 950 comprising an electrically conductive layer 909 (e.g., an optically transparent conducting oxide) on a patterned substrate surface 945, with an active layer 905 on the electrically conducting layer 909. The thickness of electrically conducting layer 909 is less than the height "h" of the surface feature giving rise to non-planar active layer 905. The electrically conducting layer can have a 25° C. bulk resistivity that is less than 1 Ω/cm. As described above, the tilted surface features can be covered with a variety of index matching layers that have a refractive index that is close to a refractive index of the active layer 905 and the substrate 901. The selection of the index matching layer material will generally be based on the refractive indexes (nfs) of the substrate 901 and/or the active layer 905, its absorption coefficient for light, effect on active layer growth, and the crystalline/amorphous structure of index matching material. An index matching material is defined herein as material having a refractive index that is within the nf of the layer to be index matched ±0.7. In one embodiment the index matching material has a refractive index that is within the nf of the layer to be index matched ±0.1. CMP can be used to polish away the overburden portion of the index matching layer material to expose a portion of substrate 901 on its top side for the epitaxial growth of active layer 905.

Figure 10A:
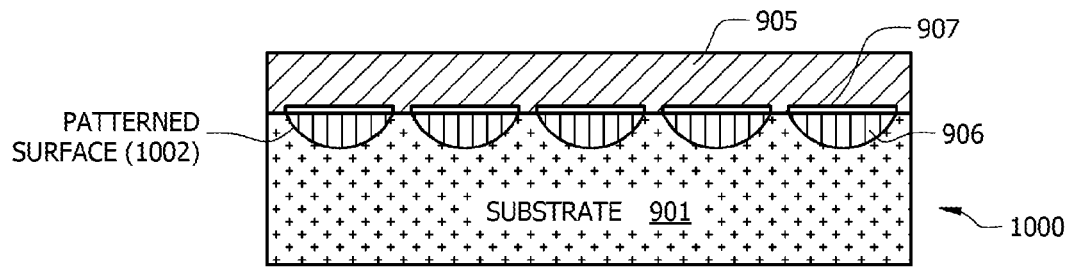
FIGS. 10A-B show cross section depictions of structures including engineered interfaces comprising titled surface features that are suitable for solid state light sources, according to disclosed embodiments.
Figure 10B:
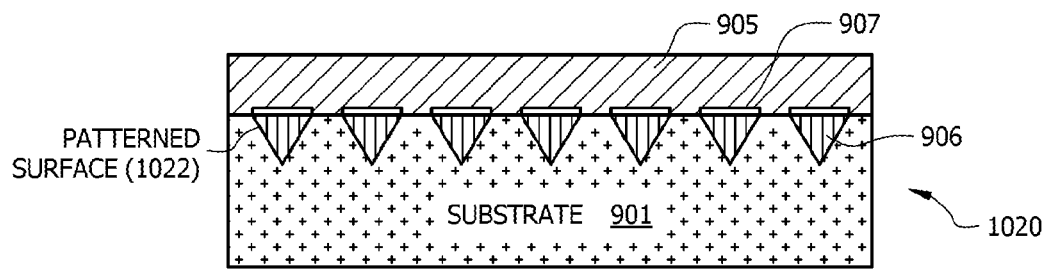

FIG. 10A shows a cross sectional depiction of a structure 1000 including an engineered interface comprising a patterned surface 1002 including a plurality of inverted microlens features comprising a relatively high $n_f$ material matching layer 906 (for matching the nf of substrate 901) filling recessed microlens feature portions, with a nucleation stop layer 907 formed over the relatively high nf index matching material 906. The active layer 905 shown can be an epitaxial layer formed after polishing away portions of nucleation stop layer 907 sufficiently to expose the top surface 902 of the substrate 901 in the regions between the features. FIG. 10B shows a cross sectional depiction of a structure 1020 including an engineered interface comprising a patterned surface 1022 including a plurality of inverted pyramid features having a relatively high nf material 906 (e.g. for matching the nf of substrate 901) filling the recessed feature portions, with a nucleation stop layer 907 formed over the relatively high nf material 906.

The substrate 901 to ambient (e.g. air) interface is referred to herein as Interface 1. Interface 1 can be important for out-coupling of substrate mode photons. Known methods for texturing use surface roughening or by having regular patterned structures at various interfaces (e.g. Bragg gratings, micro-rings, photonic crystals, microlenses, micro-pyramids). In many of these cases, the patterned structure is made on either some polymeric material or an inorganic material of lower nf relative to the nf of the substrate 901. Disclosed embodiments generally form the patterned surface using the substrate 901 itself, thus providing no nf mismatch, which results in extracting more light out of the substrate 901.

Figure 11:
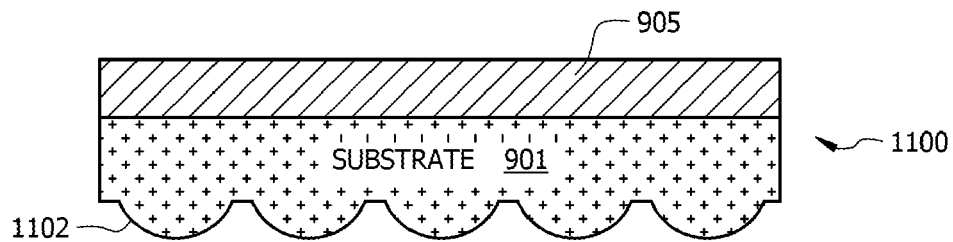
FIG. 11 shows a show cross section depiction of a structure including an engineered interfaces comprising titled surface features that are suitable for solid state light sources, according to disclosed embodiments.

FIG. 11 shows a cross sectional depiction of a structure 1100 including an engineered interface comprising a patterned surface 1102 comprising a plurality of microlenses for its air interface (Interface 1). In other disclosed embodiments, more than one interface is patterned. For example, Interfaces 1 and 2 (between substrate 901 and active or buffer layer 905) may both be patterned. Engineering both Interfaces 1 and 2 can lead to a reduction of active layer mode and substrate mode, respectively, from the solid state device, resulting in enhanced light extraction.

Figure 12A:
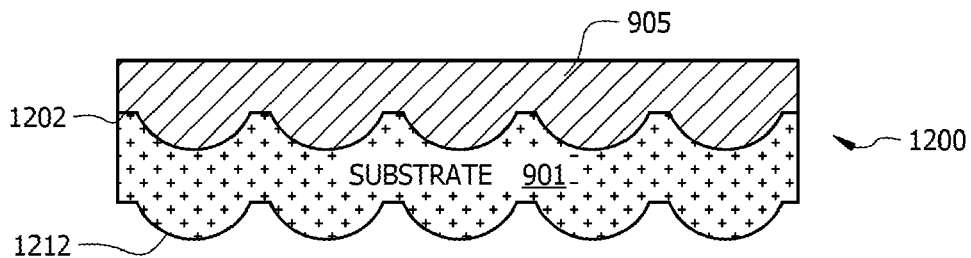
FIGS. 12A-B show cross section depictions of structures including engineered interfaces comprising titled surface features that are suitable for solid state light sources, according to disclosed embodiments.
Figure 12B:
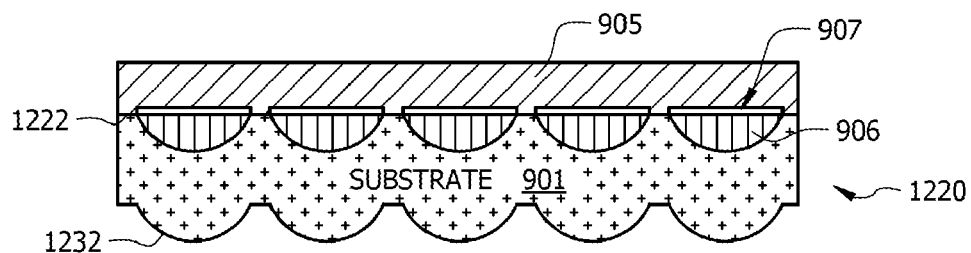

FIGS. 12A and B show cross sectional depictions of a structures including an engineered interface at interfaces 1 and 2. FIG. 12A shows a cross sectional depiction of a structure 1200 comprising a substrate 901 having a first patterned surface 1202 for interface 2 and a second patterned surface 1212 for interface 1. FIG. 12B shows a cross sectional depiction of a structure 1220 comprising a substrate 901 having a first patterned surface 1222 for interface 2 and a second patterned surface 1232 for Interface 1. FIG. 12B also shows an index matching layer 906 filling recessed feature portions, with a nucleation stop layer 907 thereon.

Figure 13:
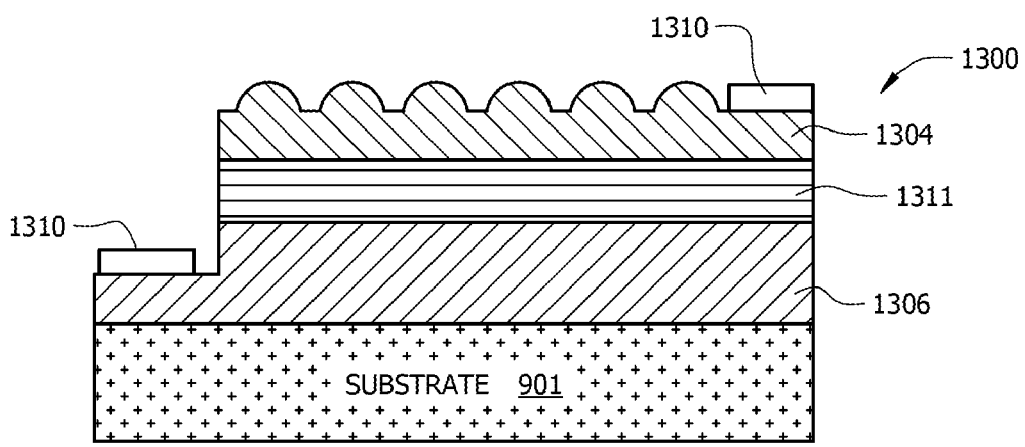
FIG. 13 shows a cross sectional depiction of a structures including engineered interfaces comprising titled surface features that are suitable for solid state light sources, according to disclosed embodiments.

FIG. 13 shows a cross sectional depiction of a top emitting LED 1300 according to a disclosed embodiment of the invention that includes a patterned top surface. LED comprises a p or n-doped region 1304 and an oppositely doped region 1306 that forms an active junction region 1311. The Interface of region 1304 with the ambient (e.g. air) is referred to herein as Interface 3. Contacts 1310 are provided for both regions 1304 and 1306. Contact layers to the doped regions 1304 and 1306 (not shown) generally provide low resistance contacts for a laser driver module (not shown) to drive LED 1300.

As known in the art, when LED 1300 is forward biased (switched on), electrons are able to recombine with holes within the active junction region 1311 of the device, releasing energy in the form of photons, with the effect called electroluminescence and the color of the light (corresponding to the energy of the photon) being determined by the energy gap of the semiconductor (e.g. AlGaN or GaN).

If the emitting layer material of the LED 1300 is an organic compound, it is referred to as an Organic Light Emitting Diode (OLED). To function as a semiconductor, the organic emitting material must generally have conjugated pi (π) bonds. The emitting material can be a small organic molecule in a crystalline phase, or a polymer. Polymer materials can be flexible, such LEDs are known as PLEDs or FLEDs.

Figure 14:
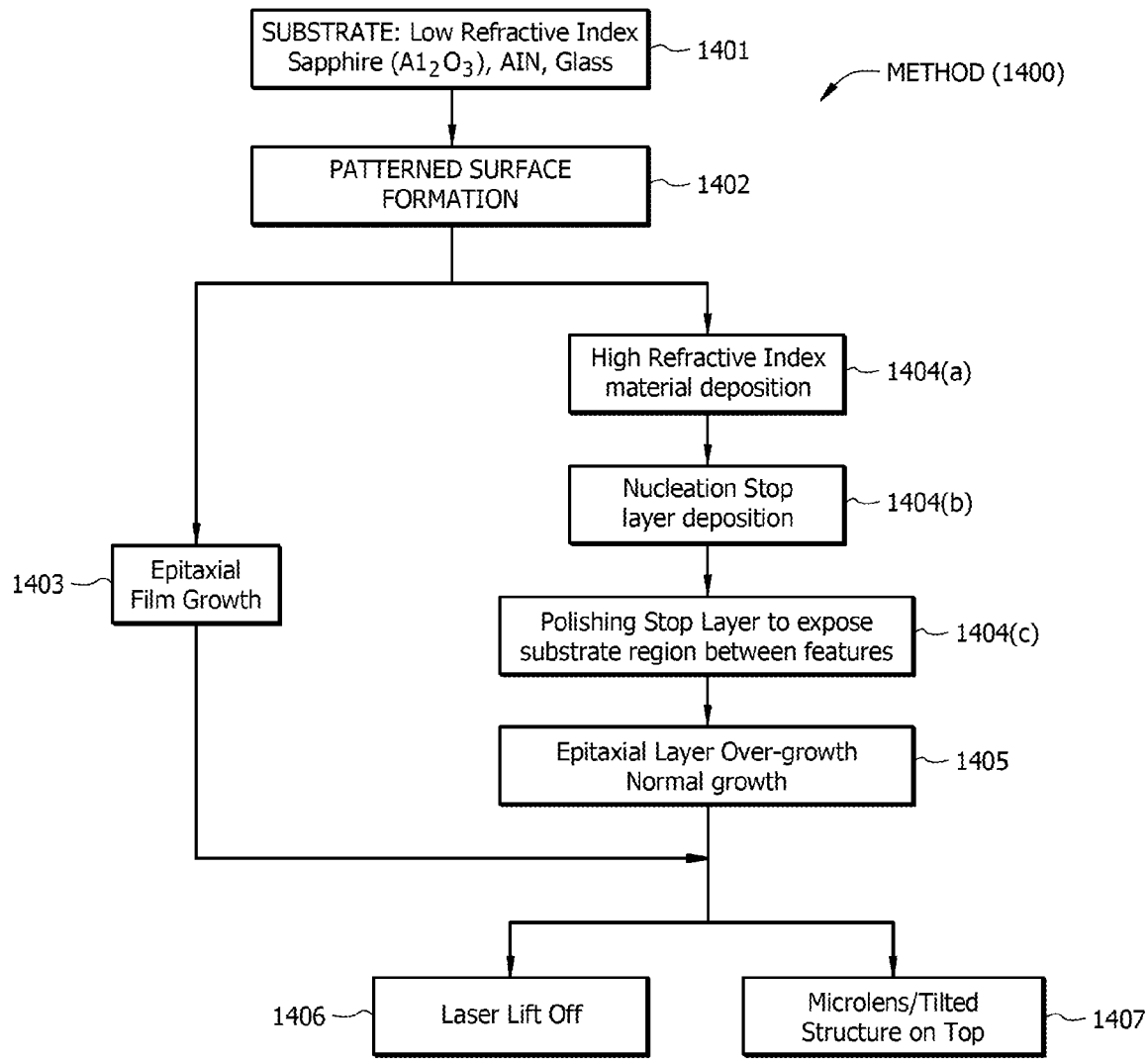
FIG. 14 is a flow chart showing several process options for LED fabrication on engineered substrates according to disclosed embodiments.

FIG. 14 is a flow chart showing several process options for LED fabrication on engineered substrates according to disclosed embodiments. Step 1401 comprises providing a substrate. In one embodiment the substrate can have a lower refractive index as compared to the subsequently deposited active layer (e.g., GaN based LEDs on a sapphire substrate). Step 1402 comprises forming a patterned substrate surface comprising a plurality of tilted features. Step 1403 comprises active layer film growth (e.g. epitaxial growth) on the patterned substrate surface. Alternatively, analogous to the process described above relative to FIGS. 10A and 10B, step 1402 can be followed by deposition of a high refractive index matching material in step 1404(a) (e.g. for filling recessed microlens feature portions) followed by deposition of a nucleation stop layer in step 1404(b) formed over the relatively high of index matching material. Step 1404(c) comprises polishing away portions of the nucleation stop layer sufficiently to expose the top surface of the substrate in the regions between the features. Step 1405 can comprise epitaxial active layer film growth. Optional steps 1406 comprising laser lift off process for removing substrate material and step 1407 comprising forming a patterned layer on the top surface of the active layer for top emitting devices or the bottom substrate surface for bottom emitting devices can also be included.

One inventive distinction for solid state light sources disclosed herein is that the chemical composition of the patterned surface can be the same at its surface (top 10 nm) as compared to its bulk, or be essentially the same composition, and thus have a minimum concentration of foreign atoms. For example, the concentration of the foreign elements is typically less than 1%, less than 0.5, or less than 0.2% by weight in the top 10 nm of the surface.

Foreign atoms are defined herein as atoms that are not a part of the substrate before etch or polishing processing and are introduced during the formation of the structure. Typically, foreign atoms that are introduced during conventional processes such as RIE in the near surface regions are non-oxidizing or inert gases such as nitrogen, argon, xenon, and krypton. Corrosive foreign materials that can also be introduced during RIE include gaseous halogens and their compounds.

For example, in one embodiment the composition ratio of GaN, SiC, sapphire, glass (e.g., Si/C in SiC, Ga/N in GaN) at the top 10 nm is less than 20 percent different, less than a 10 percent different, less than 5% different, or less than 2% different as compared to the composition in the bulk of the layer. In a typical embodiment, the surface formed by the CMF process does not generate any change in composition.

Besides introduction of foreign atoms, in conventional processes the bonding may change in the formation of the specific structure. This typically can happen in laser radiation or RIE. CMF methods for making these structures will not generally create such changes in the structural properties of the materials. Specifically the bonding change in the sub-surface region (10 nm) is typically less than 1% as compared to the bonding in the bulk material.

The compositional changes, introduction of foreign atoms, and changes in bonding can all be problematic in terms of light propagation. These changes are defects that tend to absorb emitted radiation, and thus are not desirable for the process. All techniques such as RIE, laser ablation, photochemical etching, and chemical etching generally create such defects and are thus not desirable. In contrast, solid state light devices formed by CMF processing described herein minimize compositional changes, minimize introduction of foreign atoms and minimize changes in bonding that as a result improves light propagation light extraction efficiency as a result.

The solid state light source can generate light by various means. For example, the source can be a solid state electroluminescent film (e.g., zinc sulfide based thin films), a red, green or blue light, infrared or ultraviolet LED, OLED, a laser, or a phosphor layer. In these cases the solid state material is excited by electrical stimulation. Substrates that have a nf higher than 1.2 can generally be used in this embodiment. The embodiment is particularly helpful if the difference in refractive index between two surfaces is greater than 0.2, or greater than 0.5 in another embodiment. The materials can be in form a bulk substrate or as a thin film.

Other solid state source materials which this embodiment can be applied can include phosphor materials that are excited by visible and ultraviolet light or an electron beam. As known in the art, a phosphor is a substance that exhibits the phenomenon of phosphorescence (sustained glowing after exposure to energized particles such as electrons or ultraviolet photons). Phosphors are typically transition metal compounds or rare earth compounds of various types. Phosphors are usually made from a suitable host material, to which an activator is added. The best known type is a copper-activated zinc sulfide and the silver-activated zinc sulfide (zinc sulfide silver). The refractive index of such materials is generally greater than 1.4. The materials can be in form a bulk substrate or as a thin film. This embodiment can be particularly helpful if the difference in refractive index between two surfaces is greater than 0.2 or more, and in another embodiment greater than 0.5.

Related materials which are applied in solid state sources may also be applied in other disclosed embodiments. Examples of such materials include optically transparent conducting oxides, dielectric and insulators. These materials can allow the transmission of light generated from the active layer and also help formation of electrical contacts. The refractive index of such materials is generally higher than 1.3. This embodiment can be particularly helpful if the difference in refractive index between two surfaces is greater than 0.2, such as greater than 0.5. Other related materials that can be applied to the solid state sources can include metal which can be used to reflect light and also provide electrical contacts. As used herein, "metals" refer to metal elements, alloys, mixtures, and intermetallic compounds whose 25° C. electrical resistivity is below 0.1 ohm·cm.

While various embodiments of the invention have been described above, it should be understood that they have been presented by way of example only, and not limitation. Numerous changes to the disclosed embodiments can be made in accordance with the disclosure herein without departing from the spirit or scope of the disclosed embodiments. Thus, the breadth and scope of embodiments of the invention should not be limited by any of the above described embodiments. Rather, the scope of embodiments of the invention should be defined in accordance with the following claims and their equivalents.

Although embodiments of the invention have been illustrated and described with respect to one or more implementations, equivalent alterations and modifications will occur to others skilled in the art upon the reading and understanding of this specification and the annexed drawings. In addition, while a particular feature disclosed herein may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention claimed is:

1. A method for forming a solid state light source, comprising:
   providing a substrate having a top surface and a bottom surface;
   forming at least one optically active layer on said top surface of said substrate, and
   applying chemical-mechanical fabrication (CMF) processing to at least one of said top surface before said forming said optically active layer, said bottom surface, said optically active layer or an emission surface on said optically active layer to form a patterned surface, said patterned surface comprising a plurality of tilted surface features that have a post-CMF high elevation portion and a post-CMF low elevation portion that defines a height (h), and wherein said plurality of tilted surface features define a minimum lateral dimension (r);

wherein said plurality of tilted surface features comprise at least one surface portion having a surface tilt angle from 3 to 85 degrees, wherein said patterned surface has a surface roughness <10 nm rms, and wherein said h/said r≧0.05.

2. The method of claim 1, wherein said CMF processing is applied to said top surface of said substrate to form said patterned surface before said forming said optically active layer, and said optically active layer is formed on said patterned surface.

3. The method of claim 2, wherein said optically active layer is formed on said patterned surface or on an electrically conducting layer having a 25° C. bulk resistivity less than 1Ω/cm.

4. The method of claim 2, further comprising forming an index matching layer on said patterned surface before forming said optically active layer, said index matching layer having a refractive index that is ±0.7 of a refractive index of the optically active layer.

5. The method in claim 4, further comprising an electrically conducting layer on said index matching layer.

6. The method of claim 5, wherein said planarizing comprises chemical mechanical polishing (CMP).

7. The method of claim 4, further comprising planarizing said index matching layer to expose portions of said substrate between said plurality of features, wherein said forming said optically active layer on said patterned surface comprises epitaxial growth of said optically active layer from said exposed portions of said substrate.

8. The method of claim 1, wherein said CMF processing is applied to said bottom surface of said substrate to form said patterned surface, and wherein said solid state light source is bottom-emitting.

9. The method of claim 1, wherein said CMF processing is applied to said optically active layer or said emission surface on said optically active layer to form said patterned surface, and wherein said solid state light source is top-emitting.

10. The method of claim 1, wherein said CMF processing is applied to both said top surface and said bottom surface of said substrate to form a first of said patterned surfaces on said on top surface of said substrate and a second of said patterned surfaces on said bottom surface of said substrate, and wherein said first patterned surface forms an interface with said optically active layer.

11. The method of claim 1, wherein said surface roughness is less than 3 nm rms.

12. The method of claim 1, wherein an initial surface roughness of a surface processed by said CMF to form said patterned surface is <3 Å if said initial surface roughness ≦10 Å, and said surface roughness is less than ≦ an initial surface roughness of said surface processed by said CMF to form said patterned surface if said initial roughness is greater than 10 Å.

13. The method of claim 1, wherein said patterned surface provides an LRQP distribution ratio of less than 0.5.

14. The method of claim 1, wherein said one optically active layer comprises at least one quantum well, quantum dots, a pn junction, a laser medium, phosphor, electroluminescent, or a cathodoluminescent material.

15. A solid state light source, comprising:
a substrate having a top surface and a bottom surface, and
at least one optically active layer on said top surface of said substrate,
wherein at least one of said top surface, said bottom surface, said optically active layer or an emission surface on said optically active layer includes a patterned surface comprising a plurality of tilted surface features that have a high elevation portion and a low elevation portion that defines a height (h), and wherein said plurality of tilted surface features define a minimum lateral dimension (r);
wherein said plurality of tilted surface features comprise at least one surface portion having a surface tilt angle from 3 to 85 degrees,
wherein said patterned surface has a surface roughness <10 nm rms, and
wherein said h/said r≧0.05.

16. The solid state light source of claim 15, wherein said top surface of said substrate provides said patterned surface, and said optically active layer is formed on said patterned surface.

17. The solid state light source of claim 16, wherein said optically active layer is disposed directly on said patterned surface.

18. The solid state light source of claim 15, further comprising forming an index matching layer between said patterned surface and said optically active layer, said index matching layer having a refractive index that is ±0.7 of a refractive index of the optically active layer.

19. The solid state light source of claim 18, wherein said index matching layer is a patterned layer that provides exposed portions of said substrate between said plurality of features, and wherein said optically active layer is an epitaxial layer resulting from epitaxial growth of said optically active layer from said exposed portions of said substrate.

20. The solid state light source of 15, wherein said bottom surface of said substrate provides said patterned surface, and wherein said solid state light source is bottom-emitting.

21. The solid state light source of claim 15, wherein said optically active layer or said emission surface on said optically active layer provides said patterned surface, and wherein said solid state light source is top-emitting.

22. The solid state light source of claim 15, wherein both said top surface provides a first of said patterned surface and said bottom surface provides a second of said patterned surface, and wherein said first patterned surface forms an interface with said optically active layer.

23. The solid state light source of claim 15, wherein said surface roughness is less than 3 nm rms.

24. The solid state light source of claim 15, wherein said patterned surface provides an LRQP distribution ratio of less than 0.5.

25. The solid state light source of claim 15, wherein said bottom surface of said substrate or wherein said top surface of said substrate provides said patterned surface, and wherein a composition at a top 10 nm of said plurality of patterned surface matches a composition in a bulk of said substrate.

26. The solid state light source of claim 15, wherein said solid state light source comprises a light emitting diode (LED), an organic-LED, vertical-cavity surface emitting laser (VCSEL), a quantum dot-based device, a phosphor, or an electroluminescent device.

* * * * *